(12) United States Patent
Campbell et al.

(10) Patent No.: US 7,665,325 B2
(45) Date of Patent: Feb. 23, 2010

(54) MULTI-FLUID COOLING SYSTEM AND METHOD WITH FREEZE PROTECTION FOR COOLING AN ELECTRONIC DEVICE

(75) Inventors: Levi A. Campbell, Poughkeepsie, NY (US); Richard C. Chu, Hopewell Junction, NY (US); Michael J. Ellsworth, Lagrangeville, NY (US); Madhusudan K. Iyengar, Woodstock, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 301 days.

(21) Appl. No.: 11/530,992

(22) Filed: Sep. 12, 2006

(65) Prior Publication Data

US 2008/0060368 A1 Mar. 13, 2008

(51) Int. Cl.
*F25D 11/00* (2006.01)
*F25B 45/00* (2006.01)
*H05K 7/20* (2006.01)

(52) U.S. Cl. ............................. 62/430; 62/149; 361/695

(58) Field of Classification Search .................... 62/3.2, 62/149, 259.2, 502, 174, 292; 165/804, 104.31; 361/687, 695, 698, 699, 701, 702
See application file for complete search history.

(56) References Cited

U.S. PATENT DOCUMENTS

| | | | | |
|---|---|---|---|---|
| 3,408,940 A | * | 11/1968 | McGrogan | 417/12 |
| 4,865,123 A | | 9/1989 | Kawashima et al. | 165/104.33 |
| 5,086,829 A | * | 2/1992 | Asakawa | 165/270 |
| 5,333,677 A | | 8/1994 | Molivadas | 165/32 |
| 5,680,960 A | * | 10/1997 | Keyes et al. | 222/64 |
| 6,213,194 B1 | * | 4/2001 | Chrysler et al. | 165/80.3 |
| 6,496,367 B2 | | 12/2002 | Donahoe et al. | 361/687 |

(Continued)

OTHER PUBLICATIONS

Emergency and continuous Exposure Limits for Selected Airborne Contaminates, vol. 2. Authors: Committee on Toxicology, Board on Toxicology and Environmental Health Hazards, Commission on Life Sciences, National Research Council. Publication Year:2000, p. 26.*

*Primary Examiner*—Frantz F Jules
*Assistant Examiner*—Emmanuel Duke
(74) *Attorney, Agent, or Firm*—Geraldine Monteleone, Esq.; Kevin P. Radigan, Esq.; Heslin Rothenberg Farley & Mesiti P.C.

(57) ABSTRACT

A multi-fluid cooling system and method for cooling an electronic device are provided which employ freeze protection when in a shipping state. The cooling system includes a coolant loop having an expansion tank containing first and second fluids, which are immiscible and of different densities, and the second fluid freezes at a lower temperature than the first. The coolant loop further includes a first valve for facilitating coupling of the first fluid into the coolant loop and a second valve for facilitating coupling of the second fluid into the coolant loop, the first and second valves being independently controllable. Control logic electronically controls actuation of the first and second valves to automatically pass the first fluid through the coolant loop when the system is in an operational state and to automatically maintain the second fluid in the coolant loop when the system is in a shipping state.

11 Claims, 15 Drawing Sheets

U.S. PATENT DOCUMENTS

| | | | |
|---|---|---|---|
| 6,528,194 B1 * | 3/2003 | Condit et al. | 429/26 |
| 6,646,879 B2 | 11/2003 | Pautsch | 361/699 |
| 6,705,089 B2 * | 3/2004 | Chu et al. | 62/3.2 |
| 6,792,966 B2 * | 9/2004 | Harvey | 137/265 |
| 6,973,801 B1 * | 12/2005 | Campbell et al. | 62/259.2 |
| 6,979,509 B2 * | 12/2005 | Breault et al. | 429/26 |
| 2004/0148959 A1 | 8/2004 | Munch et al. | 62/430 |
| 2004/0182099 A1 | 9/2004 | Hsu | 62/259.2 |
| 2005/0122684 A1 * | 6/2005 | Chu et al. | 361/698 |
| 2005/0247440 A1 | 11/2005 | Meissner et al. | 165/148 |
| 2005/0271908 A1 * | 12/2005 | Lin et al. | 429/13 |
| 2006/0037739 A1 * | 2/2006 | Utsunomiya | 165/104.33 |
| 2006/0060333 A1 | 3/2006 | Chordia et al. | 165/104.33 |

* cited by examiner

MULTI-FLUID COOLING SYSTEM AND METHOD WITH FREEZE PROTECTION FOR COOLING AN ELECTRONIC DEVICE

TECHNICAL FIELD

The present invention relates generally to heat transfer mechanisms, and more particularly, to cooling systems and methods for removing heat generated by one or more electronic devices. Still more particularly, the present invention relates to a liquid-to-air cooling system and method with freeze protection.

BACKGROUND OF THE INVENTION

As is known, operating electronic devices produce heat. This heat must be removed from the devices in order to maintain device junction temperatures within desirable limits, with failure to remove the heat thus produced resulting in increased device temperatures, potentially leading to thermal runaway conditions. Several trends in the electronics industry have combined to increase the importance of thermal management, including technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module. These trends have combined to create applications where it is no longer desirable to remove heat from modern devices solely by traditional air cooling methods, such as by using air cooled heat sinks with heat pipes or vapor chambers. Air cooling techniques are inherently limited in their ability to extract heat from an electronic device with high power density.

SUMMARY OF THE INVENTION

One solution is to employ a hybrid liquid-to-air cooling system which retains the advantages of air cooling at the node or system level. A hybrid liquid-to-air cooling system removes heat from an electronics device employing, for example, a water-cooled cold plate, and then rejects the heat to the room environment via a liquid-to-air heat exchanger. To obtain maximum heat transfer capability, it is desirable to use an aqueous-based cooling liquid within such a hybrid liquid-to-air cooling system.

For many systems, especially smaller systems, it is advantageous to fill and seal the cooling system with liquid in the factory prior to shipping of the system. This poses a serious problem to using water as the cooling liquid. If a system filled with water is exposed to freezing temperatures for a sufficient duration, the water may freeze, expand and burst cooling lines or damage water-filled components. When water (or an aqueous-based fluid mixture) is cooled below freezing, the material changes from a liquid state to a solid state, and undergoes a significant expansion in volume, which is as much as 10% or more for water or water-based mixtures. When water freezes in a pipe, it undergoes a similar expansion. Thus, when freezing occurs in a confined space, the ice will expand and exert extreme pressure which is often sufficient to crack a cooling line or other coolant-carrying component of the coolant loop.

Thus, presented herein is a liquid-to-air cooling system and method with freeze protection for cooling an electronic device. In one aspect, the cooling system includes a coolant loop comprising at least one expansion tank. The at least one expansion tank contains a first fluid and a second fluid. The first fluid and the second fluid are immiscible, the first fluid has superior cooling properties compared with the second fluid, and the second fluid freezes at a lower temperature than the first fluid. The coolant loop further includes multiple valves, including a first valve and a second valve for controllably coupling the first fluid and second fluid into the coolant loop. The first valve and the second valve are independently controllable by control logic, which controls actuation of the first valve and the second valve to automatically pass the first fluid through the coolant loop when the cooling system is in an operational state, and to automatically maintain the second fluid in the coolant loop when the cooling system is in a shipping state.

Additionally, a cooled electronics system is provided which includes at least one electronic device and a cooling system for cooling the at least one electronic device. The cooling system includes a coolant loop comprising at least one expansion tank. The at least one expansion tank contains a first fluid and a second fluid. The first fluid and the second fluid are immiscible, the first fluid has superior cooling properties compared with the second fluid, and the second fluid freezes at a lower temperature than the first fluid. The coolant loop further includes multiple valves, including a first valve and a second valve for controllably coupling the first fluid and the second fluid into the coolant loop. The first valve and the second valve are independently controllable by control logic, which controls actuation of the first valve and the second valve to automatically pass the first fluid through the coolant loop when the cooling system is in an operational state, and to automatically maintain the second fluid in the coolant loop when the cooling system is in a shipping state.

In a further aspect, a method of fabricating a cooling system with freeze protection is provided. The method includes: providing a coolant loop including at least one expansion tank, the at least one expansion tank containing a first fluid and a second fluid, the first fluid and the second fluid being immiscible, with the first fluid having superior cooling properties compared with the second fluid and the second fluid freezing at a lower temperature than the first fluid, and wherein the coolant loop further includes multiple valves, the multiple valves including a first valve and a second valve coupled to the at least one expansion tank for controllably coupling the first fluid and the second fluid into the coolant loop, the first valve and the second valve being independently controllable; and providing control logic for controlling actuation of the first valve and the second valve, the first valve and the second valve being controlled by the control logic to automatically pass the first fluid through the coolant loop when the cooling system is in an operational state and being controlled by the control logic to automatically maintain the second fluid in the coolant loop when the cooling system is in a shipping state.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 4A-4D depict transition of the multi-fluid cooling system of FIGS. 2 & 3 from the shipping state to an operational state, wherein: in FIG. 4A the closed first valve is opened, and the opened second valve is closed; in FIG. 4B, the primary coolant is beginning to be pumped through the coolant loop; while FIGS. 4C & 4D illustrate progression of the primary coolant through the coolant loop, with corresponding movement of the freeze protect fluid into the expansion tank, in accordance with an aspect of the present invention;

BEST MODE FOR CARRYING OUT THE INVENTION

As used herein "electronic device" comprises any heat generating electronic component of a computer system or other electronic system requiring cooling. In one example, the electronic device is or includes one or more integrated circuit chip, and/or electronic component (either unpackaged or packaged in an electronic module). As one example, the electronic device may comprise part of an electronic system disposed, for example, in an electronics rack. A "liquid-to-air heat exchanger" means any heat exchange mechanism through which liquid coolant can circulate; and includes, one or more discrete heat exchange devices coupled either in series or in parallel. A heat exchange device may comprise, for example, one or more coolant flow paths, formed of thermally conductive fluid conduit (such as copper, brass or other tubing) in thermal contact with a plurality of air-cooled primary fins (formed of a thermally conductive material, such as copper). Unless otherwise specified, size, configuration and construction of the liquid-to-air heat exchanger referenced herein can vary without departing from the scope of the present invention.

Generally stated, provided herein in one aspect is an enhanced liquid-to-air cooling system for cooling an electronic device which possess freeze protection when in a shipping state without degrading functioning of the cooling system when in an operational state. The system employs multiple fluids, including a first or primary fluid or coolant (i.e., first liquid) and a second or freeze protect fluid (i.e., second liquid). The primary coolant and freeze protect fluid are immiscible and (in one embodiment) have different densities. Additionally, the primary coolant possesses superior cooling properties compared with the freeze protect fluid, and the freeze protect fluid has a lower freezing temperature than the primary coolant. By way of example, the primary coolant is water or an aqueous-based coolant, while the freeze protect fluid is a fluorocarbon liquid, which freezes, for example, at a temperature less than −40° C. Those skilled in the art will note, however, that the concepts presented herein are applicable to other first and second fluids having the characteristics described herein.

As noted above, performance of computers continues to increase in both speed and function. Heat dissipated by electronic devices (and in particular, processor chips) is increasing correspondingly. Processor chips with an average heat flux of more than 100 W/cm$^2$ and a "hot spot" heat flux approaching 300 W/cm$^2$ are already being considered, and within the next few years these heat flux levels could reach 200 and 450 W/cm$^2$, respectively. The chip heat loads under consideration already exceed the capability of even the most effective air cooling apparatuses.

Figure 1:
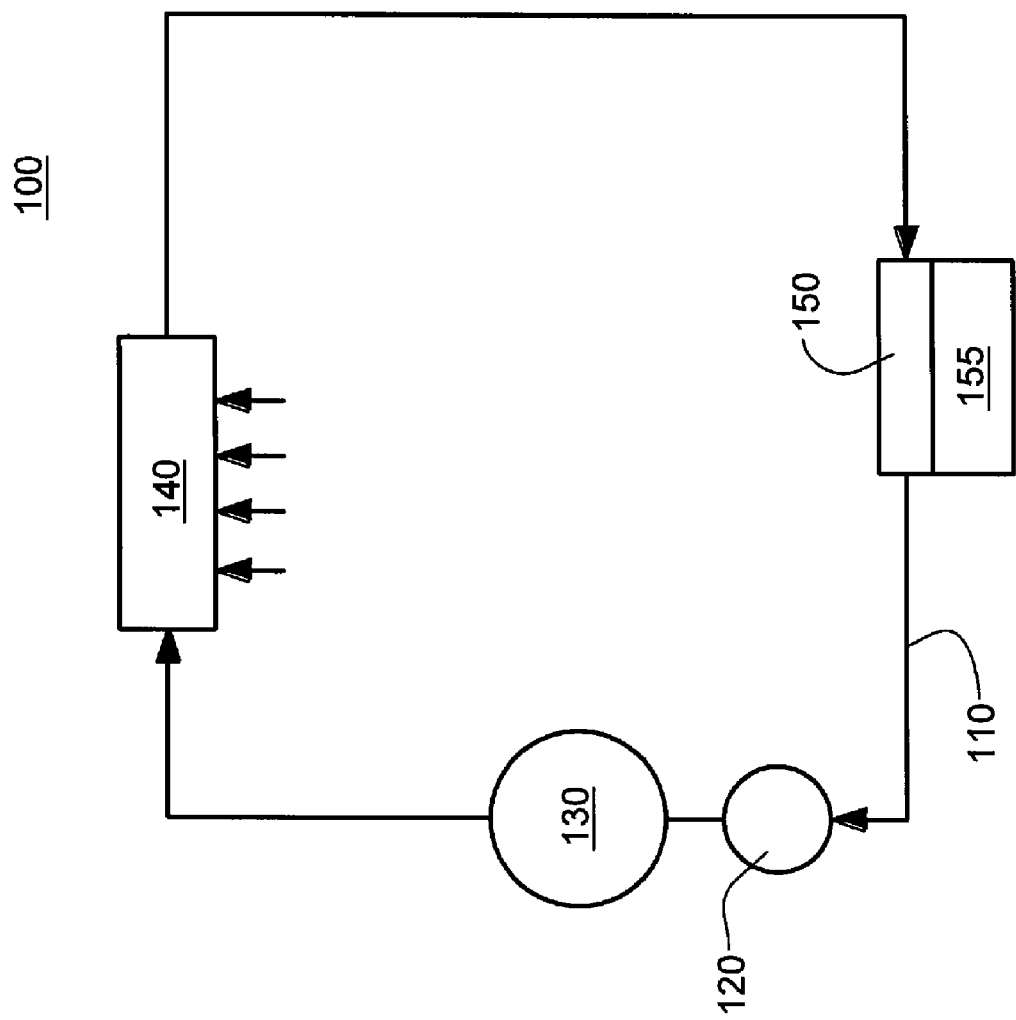
FIG. 1 depicts one embodiment of a hybrid liquid-to-air cooling system employing water as the cooling liquid.

One solution is to employ a hybrid liquid-to-air cooling system, which retains the advantages of air cooling at the node or system level. One embodiment of such a liquid-to-air cooling system 100 is depicted in FIG. 1. Liquid-to-air cooling system 100 includes a coolant loop 110 in fluid communication with a liquid reservoir 120, a fluid pump 130, a liquid-to-air heat exchanger 140 and a cold plate 150. As shown, cold plate 150 is coupled to an electronic device 155 to be cooled. In operation, the coolant (such as an aqueous-based solution) flows through the liquid-to-air heat exchanger where it is cooled prior to passing through cold plate 150. Ideally, it would be desirable to employ water as the coolant within the hybrid cooling system since water provides optimal heat transfer characteristics.

As noted, it is often desirable to fill and seal the cooling system with liquid in the factory for shipping. This poses a serious problem when water is the coolant, due to the potential for freezing and the damage that can result there from.

Figure 2:
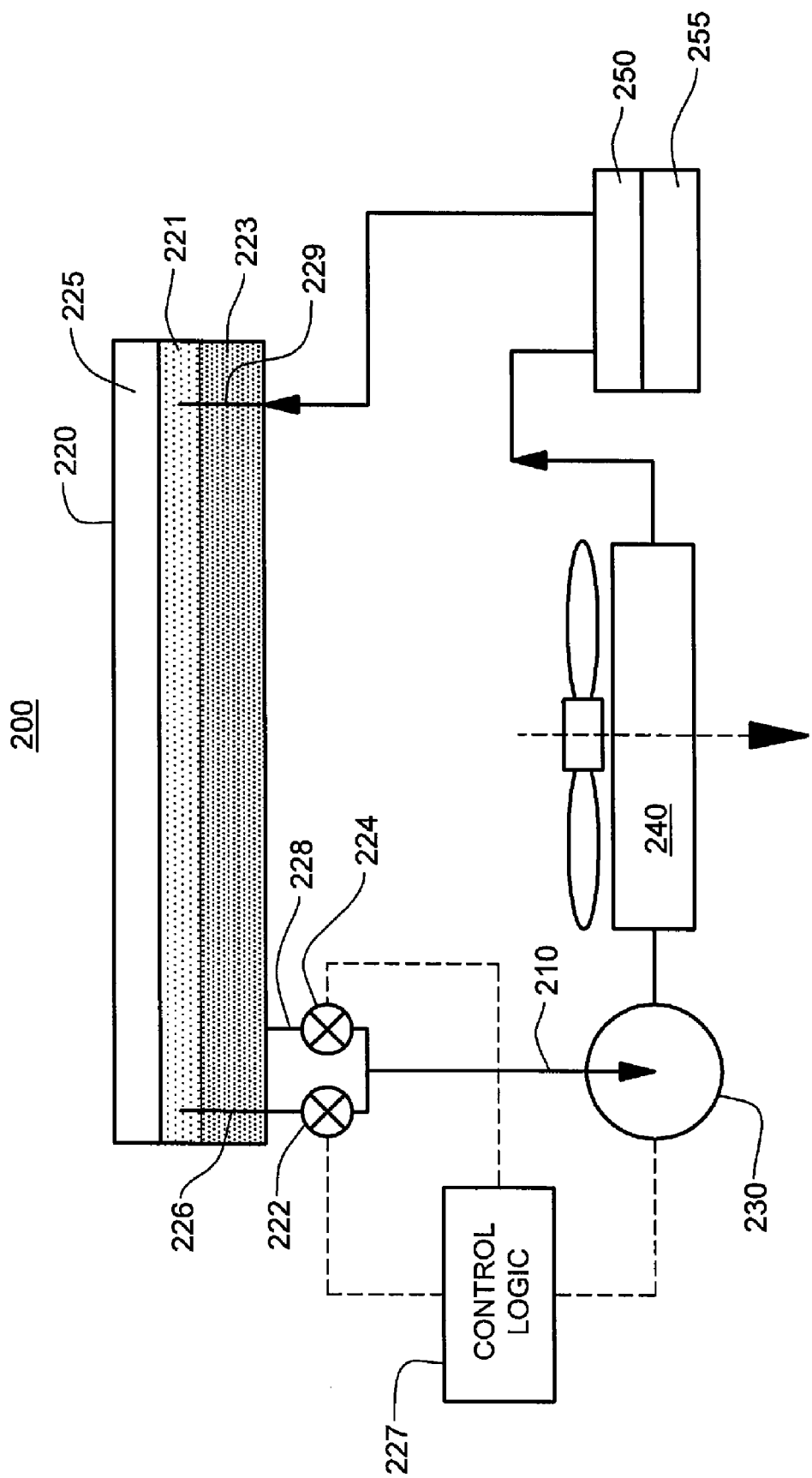
FIG. 2 is a schematic of one embodiment of a multi-fluid, liquid-to-air cooling system with freeze protection, in accordance with an aspect of the present invention.

As shown in FIG. 2, a liquid-to-air cooling system 200, in accordance with an aspect of the present invention, advantageously employs multiple fluids within the cooling system. More particularly, a freeze protect fluid 223 is employed along with a primary coolant 221 to replace the primary coolant within critical components of the coolant loop when the cooling system is in a shipping state, thereby preventing damage to the cooling system due to freezing of the primary coolant. In one example, the liquid-to-air cooling system 200 includes a coolant loop 210, with an expansion tank 220 (i.e., multi-fluid reservoir), a fluid pump 230, a liquid-to-air heat exchanger 240, and a cold plate 250, which is shown coupled to an electronic device 255 to be cooled. Control logic 227 is coupled to a first valve 222 and a second valve 224, as well as fluid pump 230 for automatically, electronically controlling operation of first valve 222, second valve 224 and fluid pump 230. Within expansion tank 220, an air space 225 is provided as an expansion space, for example, should primary coolant 221 freeze when the cooling system is being shipped. As explained further below, first valve 222 and second valve 224 are independently controllable by control logic 227, with first valve 222 controllably coupling first fluid 221 into the active components of coolant loop 210 and second valve 224 controllably coupling second fluid 223 into the active components of coolant loop 210. By way of specific example, valves 222, 224 are each solenoid valves.

In one example, first fluid 221 is water, or an aqueous-based solution, and second fluid 223 is fluorocarbon, which has a greater density than water. Thus, fluorocarbon 223 resides in a lower portion of expansion tank 220, and water 221 resides in an upper portion of the expansion tank. For the shipping state, water 221 is completely returned to the expansion tank, and replaced with the fluorocarbon liquid within the coolant loop. Because fluorocarbon liquid has a significantly lower freezing point than water, it functions as a freeze protect fluid preventing damage to the cooling system (e.g., hoses, cold plate, fluid pump and heat exchanger) should the cooling system be exposed to temperatures below freezing. Once the cooling system is installed and ready for operation, the cooling system is transitioned from the shipping state to an operating state wherein the fluorocarbon is returned to the expansion tank and the water is circulated through the coolant loop (as explained further below).

As also shown in FIG. 2, the water supply line 226 in fluid communication with first valve 222 extends into expansion tank 220 to an upper portion of the expansion tank, while the fluorocarbon supply line 228, in fluid communication with second valve 224, extends to a lower portion of expansion tank 220. Common fluid return 229 into expansion tank 220 extends (in this example) into the upper portion of the expansion tank. The water supply line is sized to extend into an area of the expansion tank guaranteed by the immiscibility of the first and second fluids, to only contain water. In one example, the liquid-to-air cooling system is filled with nearly equal amounts of water and fluorocarbon.

Figure 3:
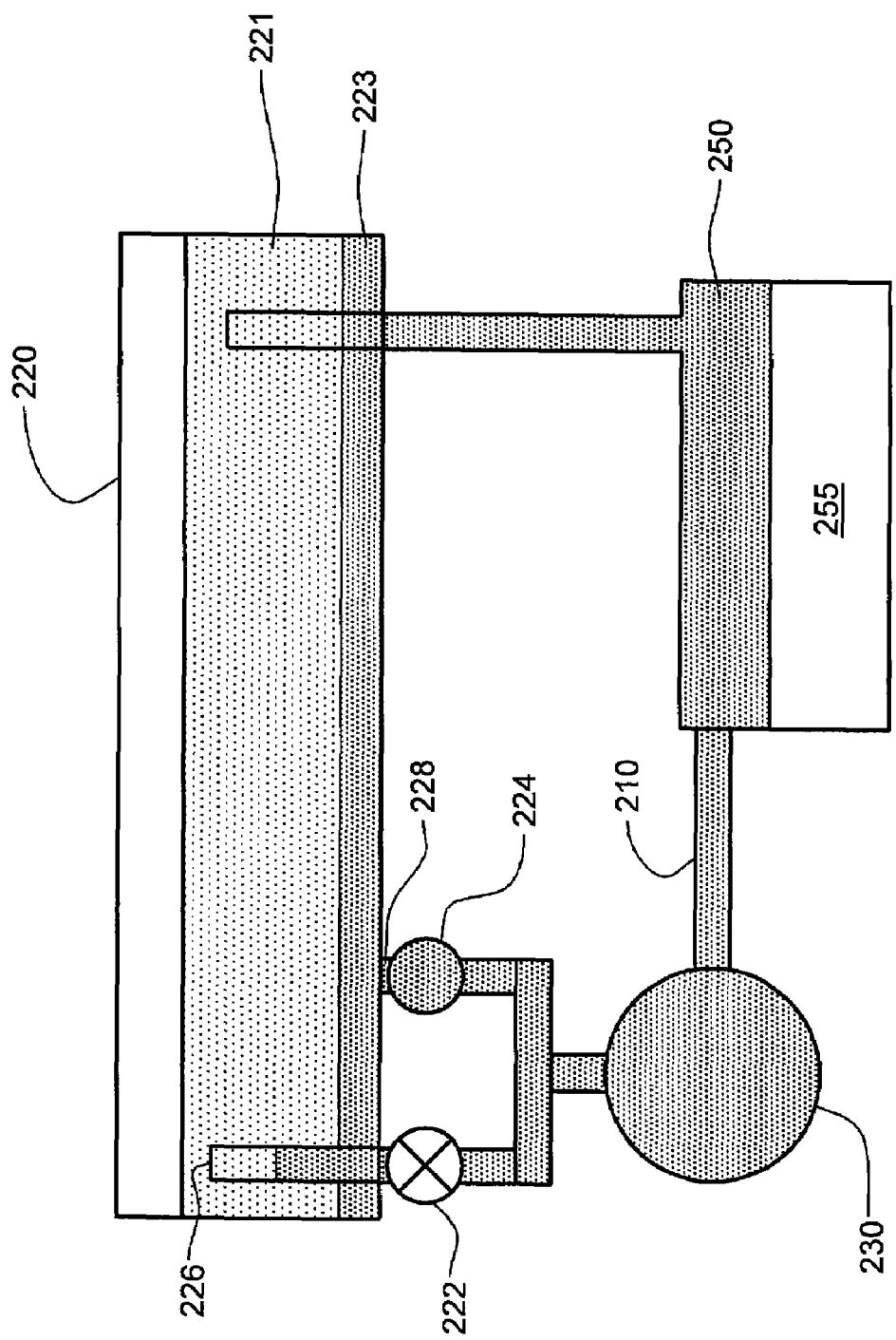
FIG. 3 is a simplified depiction of the multi-fluid cooling system of FIG. 2, showing the cooling system in a shipping state with the freeze protect fluid maintained in the coolant loop, in accordance with an aspect of the present invention.

FIG. 3 is a simplified depiction of the liquid-to-air cooling system of FIG. 2, showing the system in the shipping state, while FIGS. 4A-4D illustrate transitioning of the system from the shipping state to the operating state. FIG. 5 is a simplified depiction of the liquid-to-air cooling system of FIG. 2 shown in the operating state, while FIGS. 6A-6E illustrate transition of the system from the operating state back to the shipping state. In these figures, the control logic and liquid-to-air heat exchanger are omitted for simplicity. However, the following discussion assumes their existence within the cooling system. Further, the same reference numbers are used throughout the different figures to designate the same or similar components to those described above in connection with FIG. 2.

As noted, FIG. 3 depicts the cooling system of FIG. 2 in a shipping state, ready for shipping and possible exposure to sub-freezing temperatures. Advantageously, employing fluorocarbon liquid within the coolant loop protects active cooling system components from freezing during the shipping phase. The fluorocarbon liquid is then automatically replaced with water once the cooling system is powered on, as explained further herein. Use of the dual fluids provide a mechanism which allows water to be employed within the electronics cooling system, and allows the water to be sealed within the cooling system during the manufacturing process without subsequent risk of freezing damage during shipping of the cooling system.

In the shipping state, the expansion tank contains the complete charge of water. Sufficient air space is provided in the expansion tank above the water to allow the water to expand upwards without undue pressure should freezing occur. A lesser amount of fluorocarbon liquid also remains (in this example) in the lower portion of the expansion tank. Because of their immiscibility, the water and fluorocarbon liquid do not mix, and the fluorocarbon remains below the water due to its higher density.

In the shipping state of FIG. 3, first valve 222 is closed (as represented by the "X"), while second valve 224 is open. Thus, water supply line 226 is isolated from the coolant loop 210, while fluorocarbon supply line 228 is in fluid communication with coolant loop 210. Fluid pump 230 is deactivated, and the active components of the coolant loop, including cold plate 250 (coupled to electronic device 255), are filled with the fluorocarbon liquid.

Figure 4A:
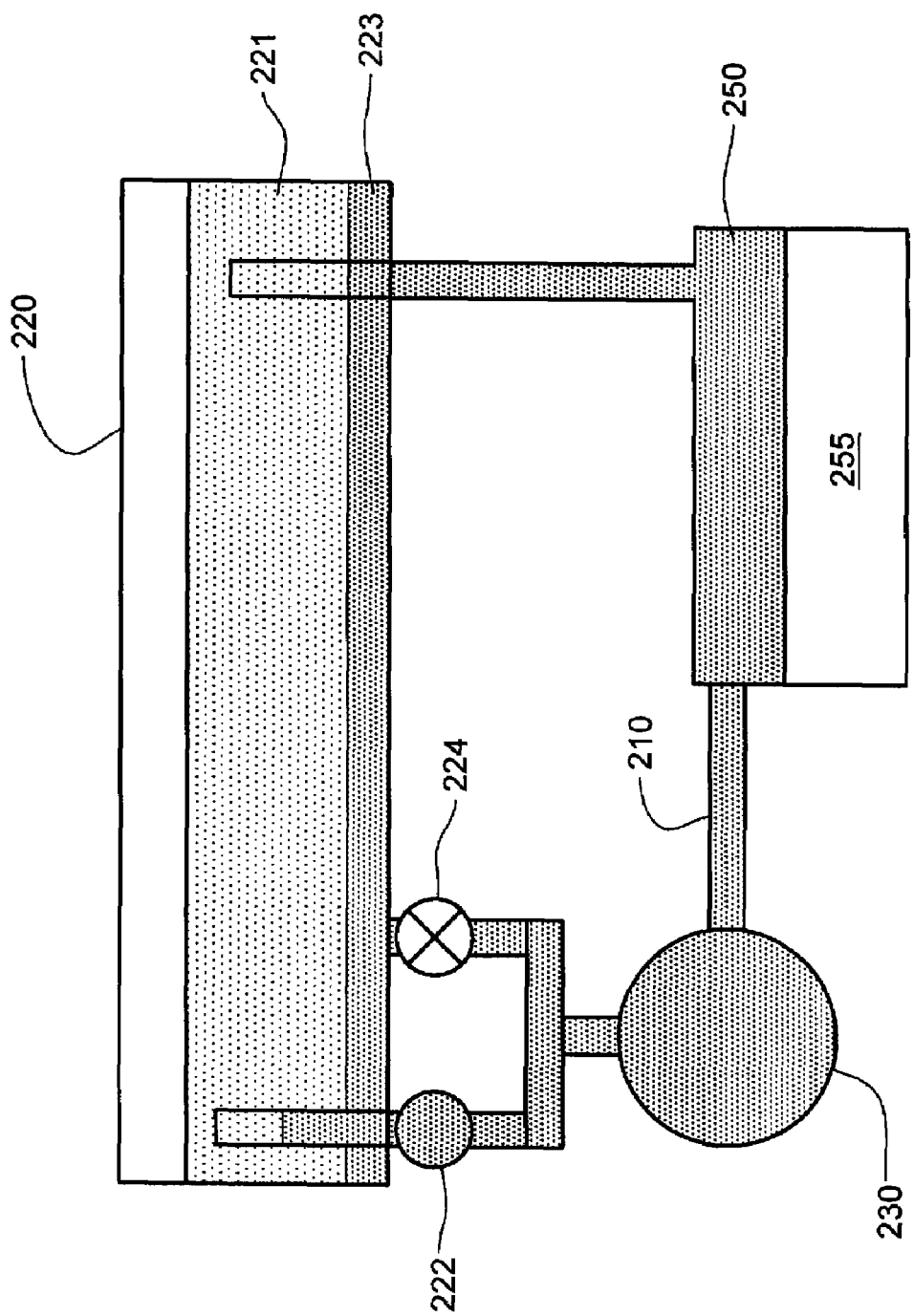
Figure 4B:
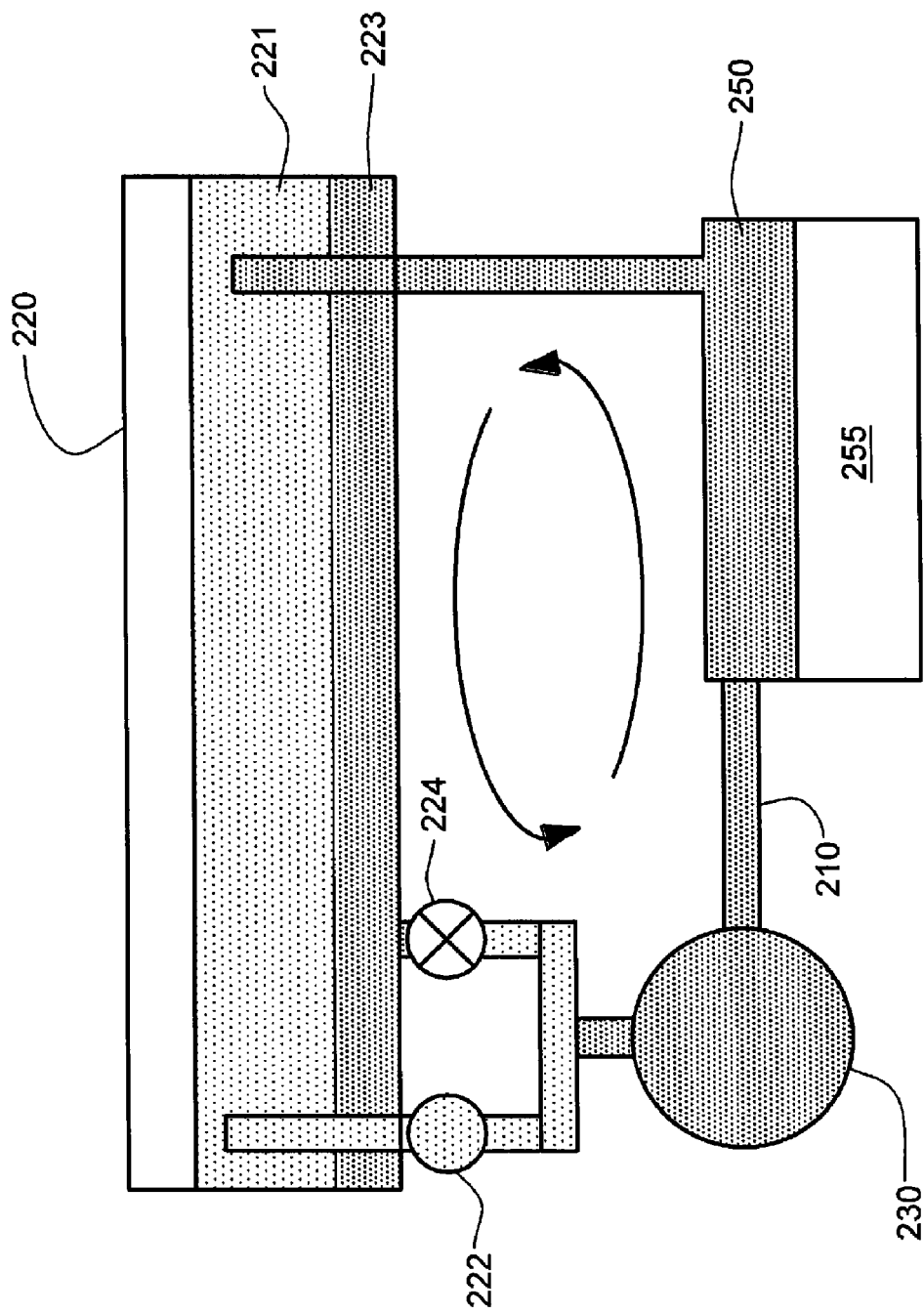
Figure 4C:
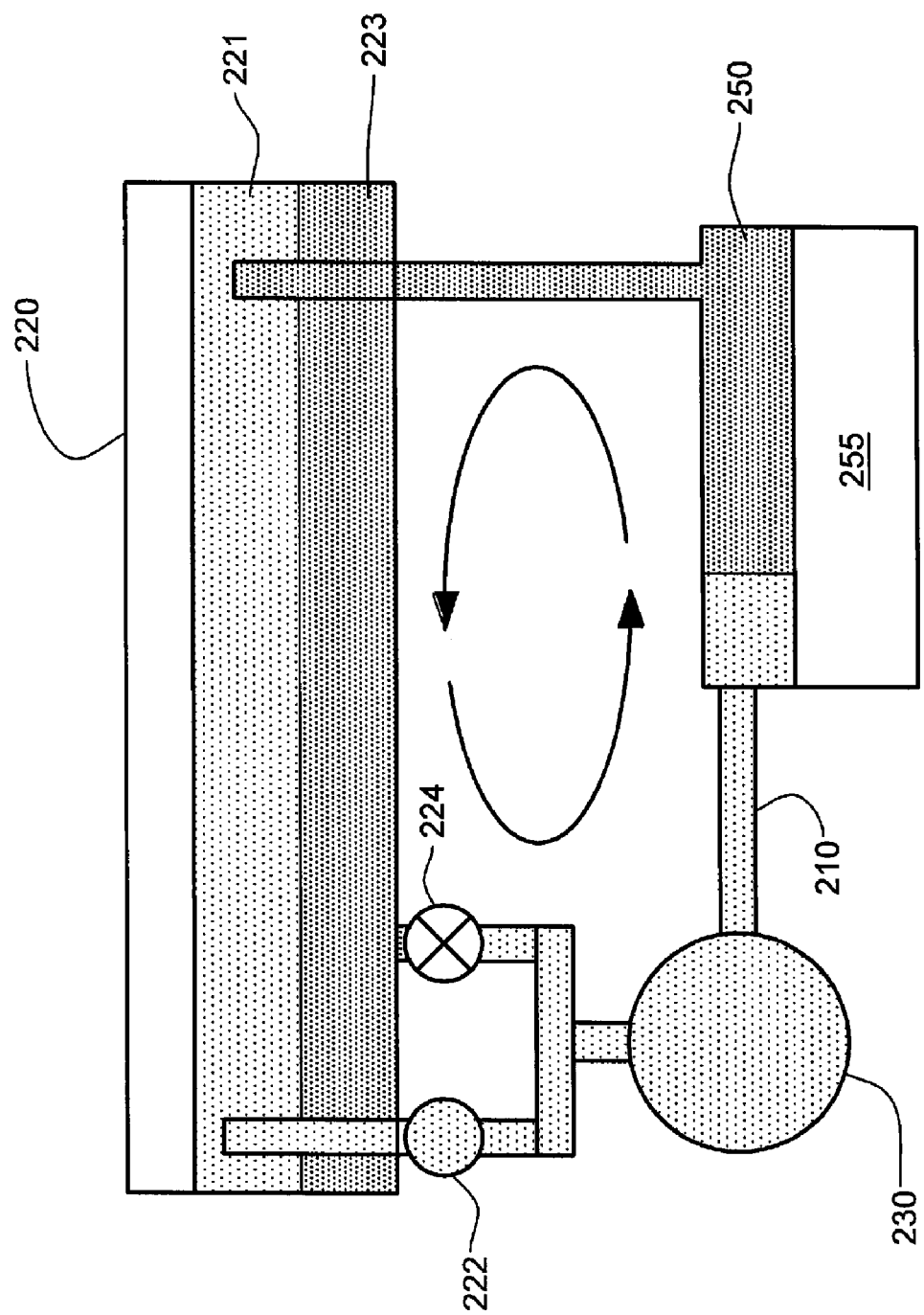
Figure 4D:
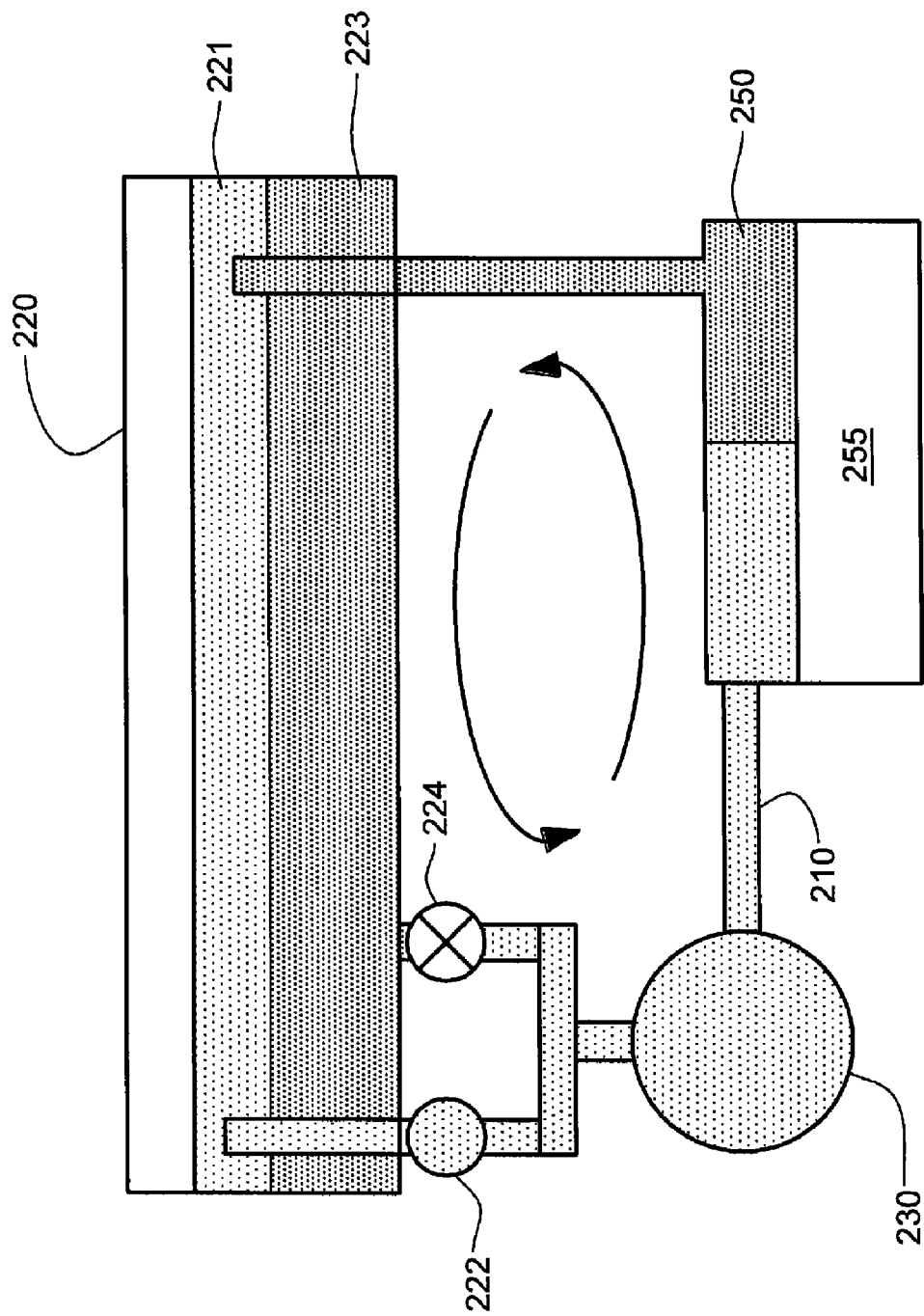
Figure 5:
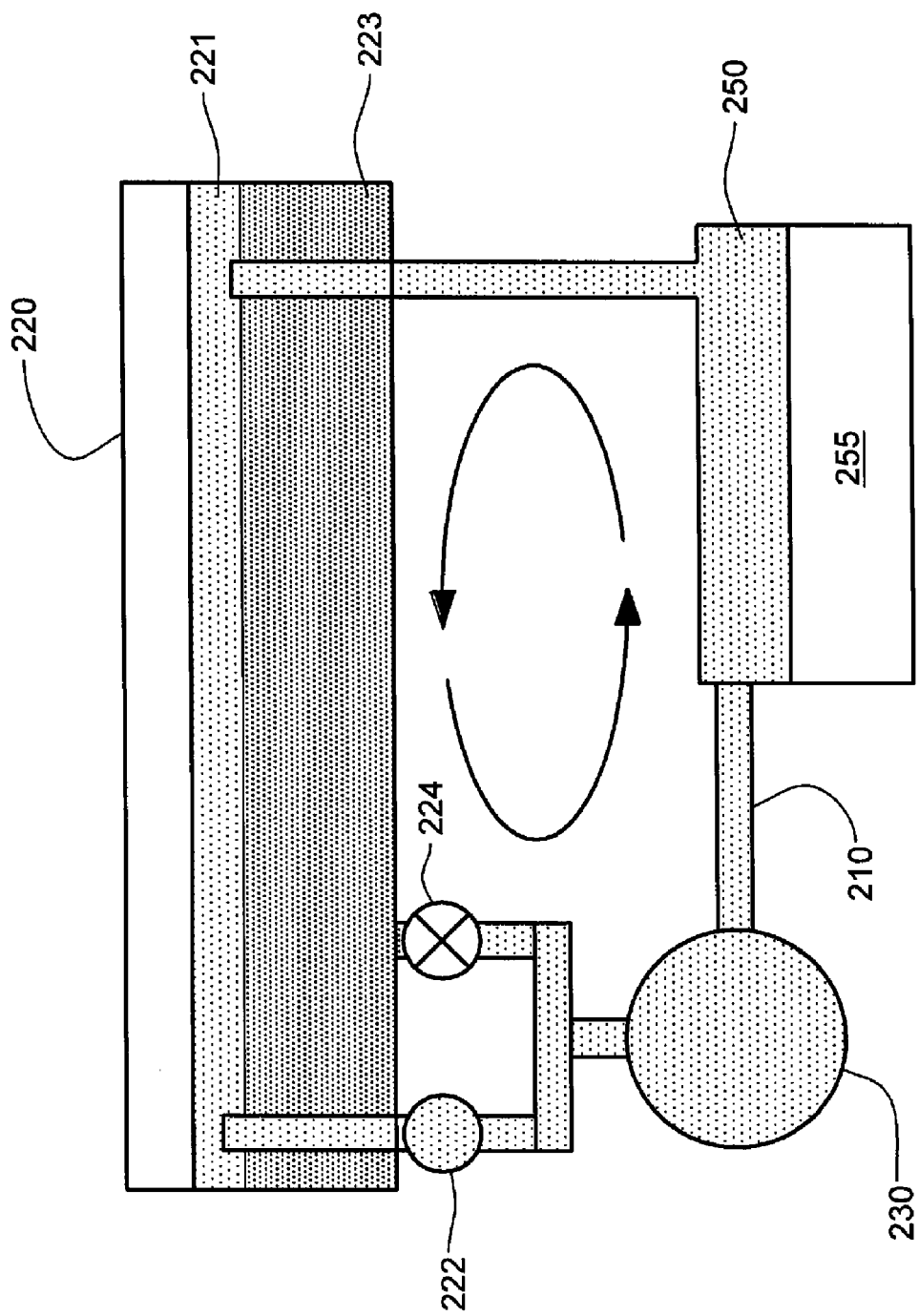
FIG. 5 is a simplified depiction of the multi-fluid cooling system of FIG. 2 shown in an operational state with the primary coolant circulating through the coolant loop, in accordance with an aspect of the present invention.

As noted, FIGS. 4A-4D depict automated transitioning of the cooling system from the shipping state to the operational state. Upon arrival at a customer site, the computer system and cooling system are installed and made ready to operate. As the cooling system is powered up for the first time, valve 222 is automatically opened to allow entry of water into the main coolant loop 210 (see FIG. 4A). Immediately following this action, valve 224 is closed to prevent entry of fluorocarbon into the coolant loop. Fluid pump 230 is then activated to begin flushing the fluorocarbon 223 from active portions of the coolant loop 210 (for example, cold plate 250) into expansion tank 220. FIG. 4B depicts water progressing through the water supply line and valve 222 towards pump 230, while FIGS. 4C & 4D depict further replacement of the fluorocarbon with water during the transition from the shipping state to the operational state. The operational state is achieved once the fluorocarbon 223 is fully flushed and replaced by water 221 within the active components of coolant loop 210, as shown in FIG. 5.

In this embodiment, it is assumed that in the operational state a certain amount of water 221 remains within expansion tank 220 as reserve for the water within the active portions of the coolant loop, while the fluorocarbon remains basically stagnant within the expansion tank. Once the cooling system reaches the operational state depicted in FIG. 5, power may be applied to the electronic device (e.g., electronic module or modules) to be cooled.

Figure 6A:
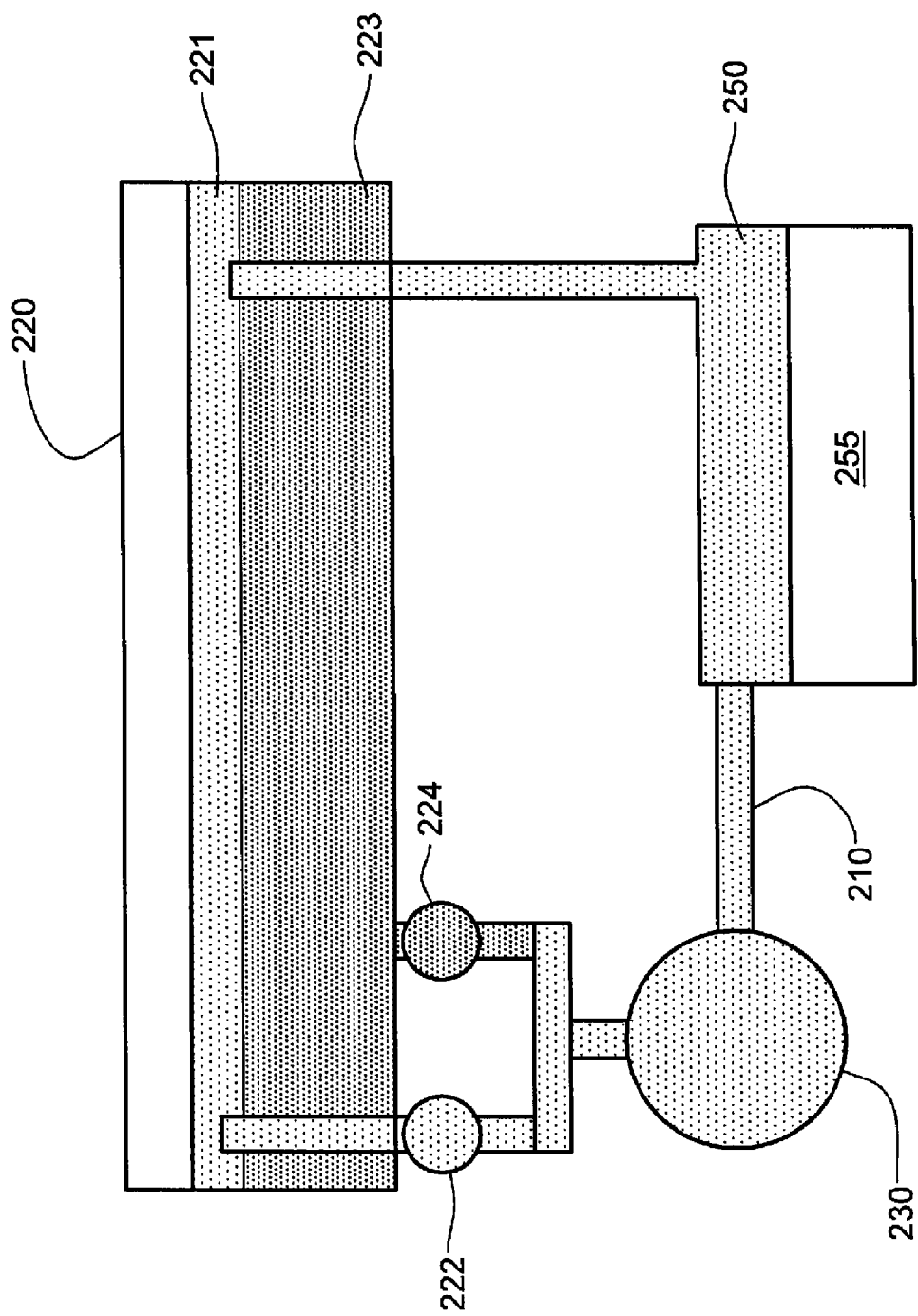
FIGS. 6A-6E illustrate transition of the multi-fluid cooling system of FIG. 5 from the operational state to the shipping state, wherein in FIG. 6A the pump is idled, and the second valve is opened, allowing the freeze protect fluid to displace by gravity the primary fluid as shown in FIG. 6B, while in FIG. 6C, the first valve is closed and the pump is activated to pump the freeze protect fluid through the coolant loop, as illustrated in FIGS. 6D & 6E, with the resultant shipping state being illustrated in FIG. 3, in accordance with an aspect of the present invention.
Figure 6B:
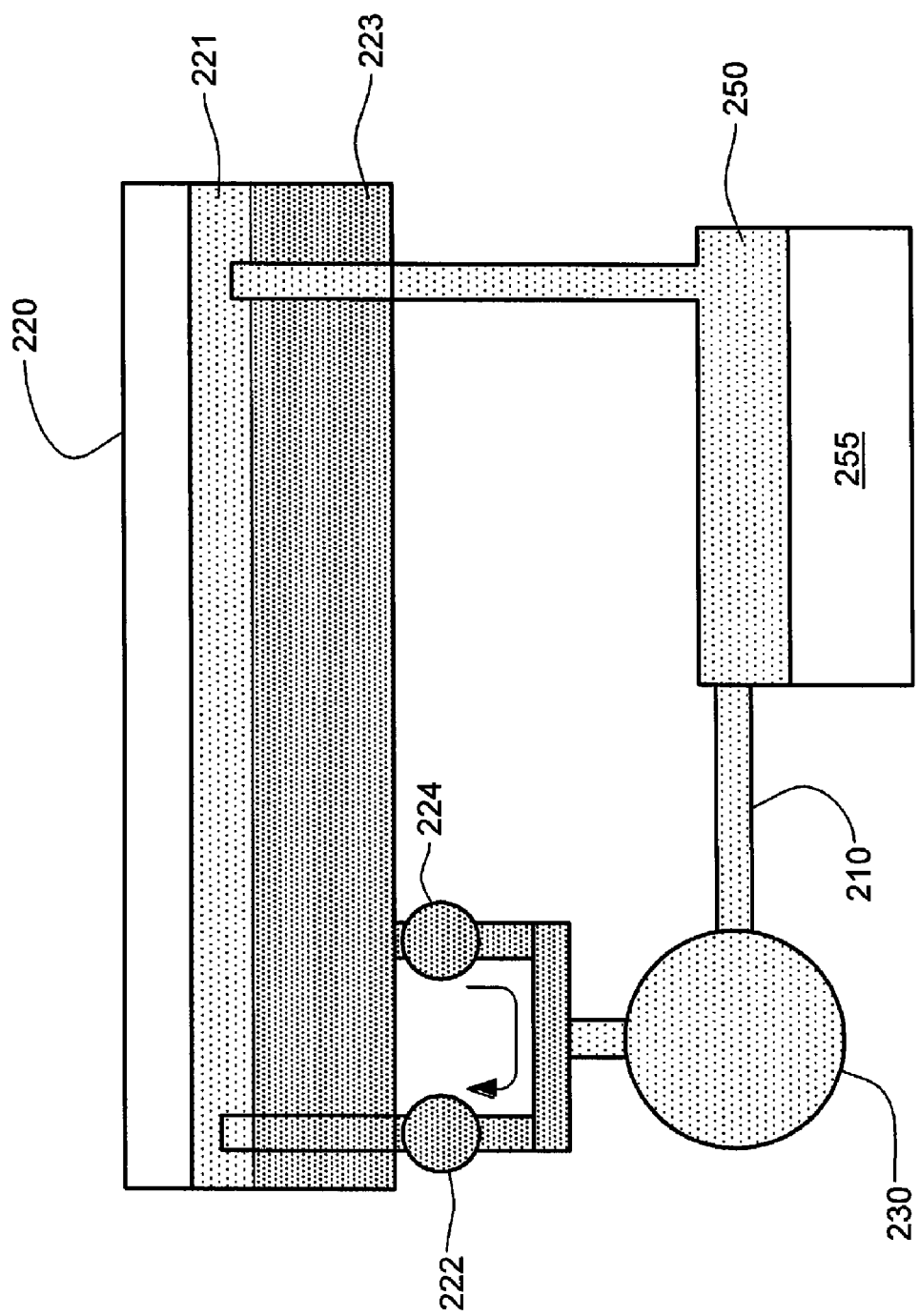
Figure 6C:
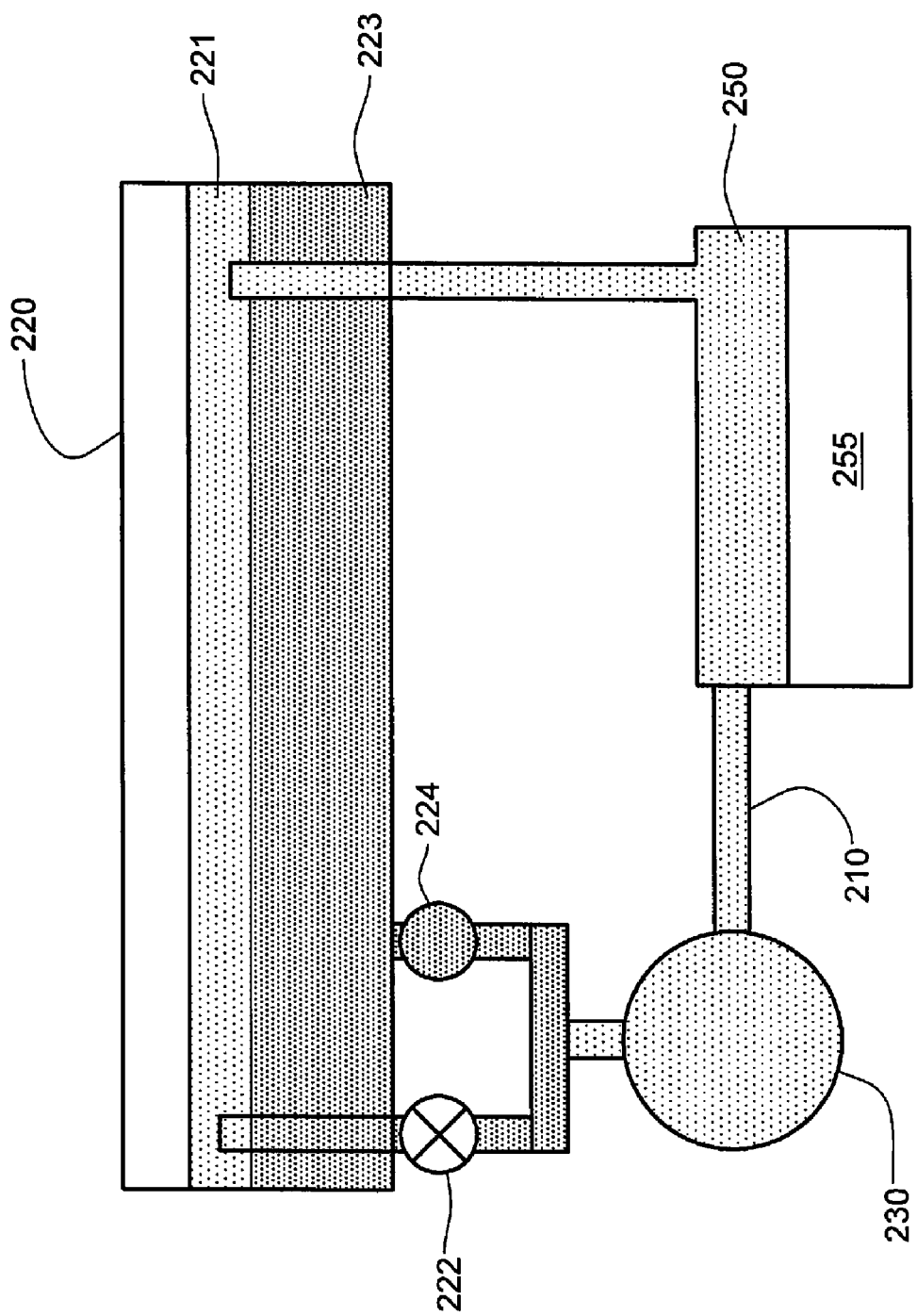

FIGS. 6A-6E depict automated transitioning of the cooling system from the operational state back to the shipping state. For example, if the associated computer system being cooled by the cooling system needs to be shipped to another location, the cooling system can be automatically returned to its shipping state. With fluid pump 230 active, valve 224 in the fluorocarbon supply line is opened to allow fluorocarbon to enter the main supply line. After opening valve 224, fluid pump 230 is deactivated (as shown in FIG. 6A), resulting in the fluorocarbon 223 flowing through valve 224 into valve 222 and upwards into the water supply line. More particularly, gravity is employed in this embodiment to feed the more dense fluorocarbon liquid 223 into the water supply line controlled by valve 222. Fluorocarbon liquid 223 will achieve a level within the water supply line roughly the level of the fluorocarbon liquid within expansion tank 220, as illustrated in FIG. 6B.

Figure 6D:
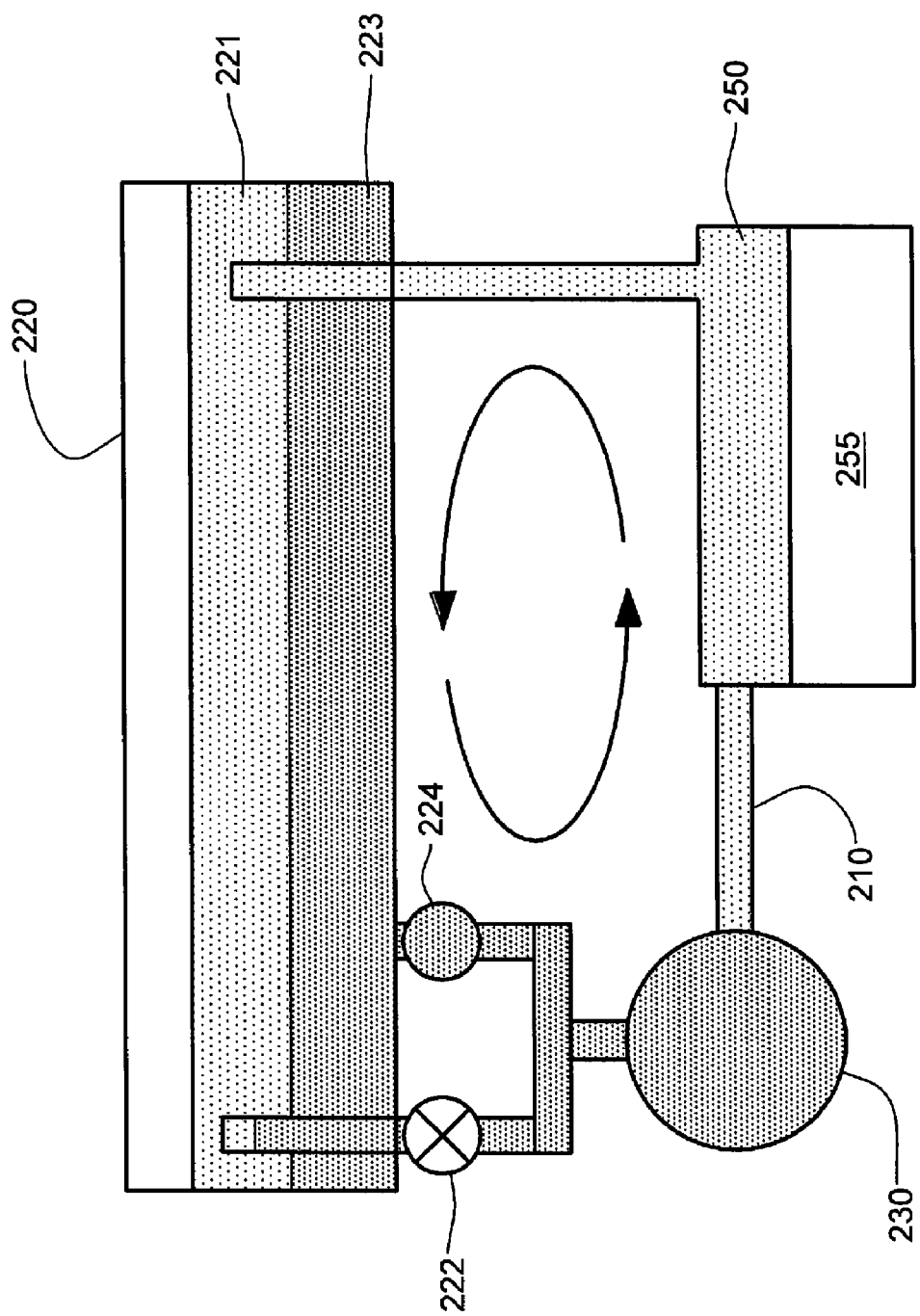
Figure 6E:
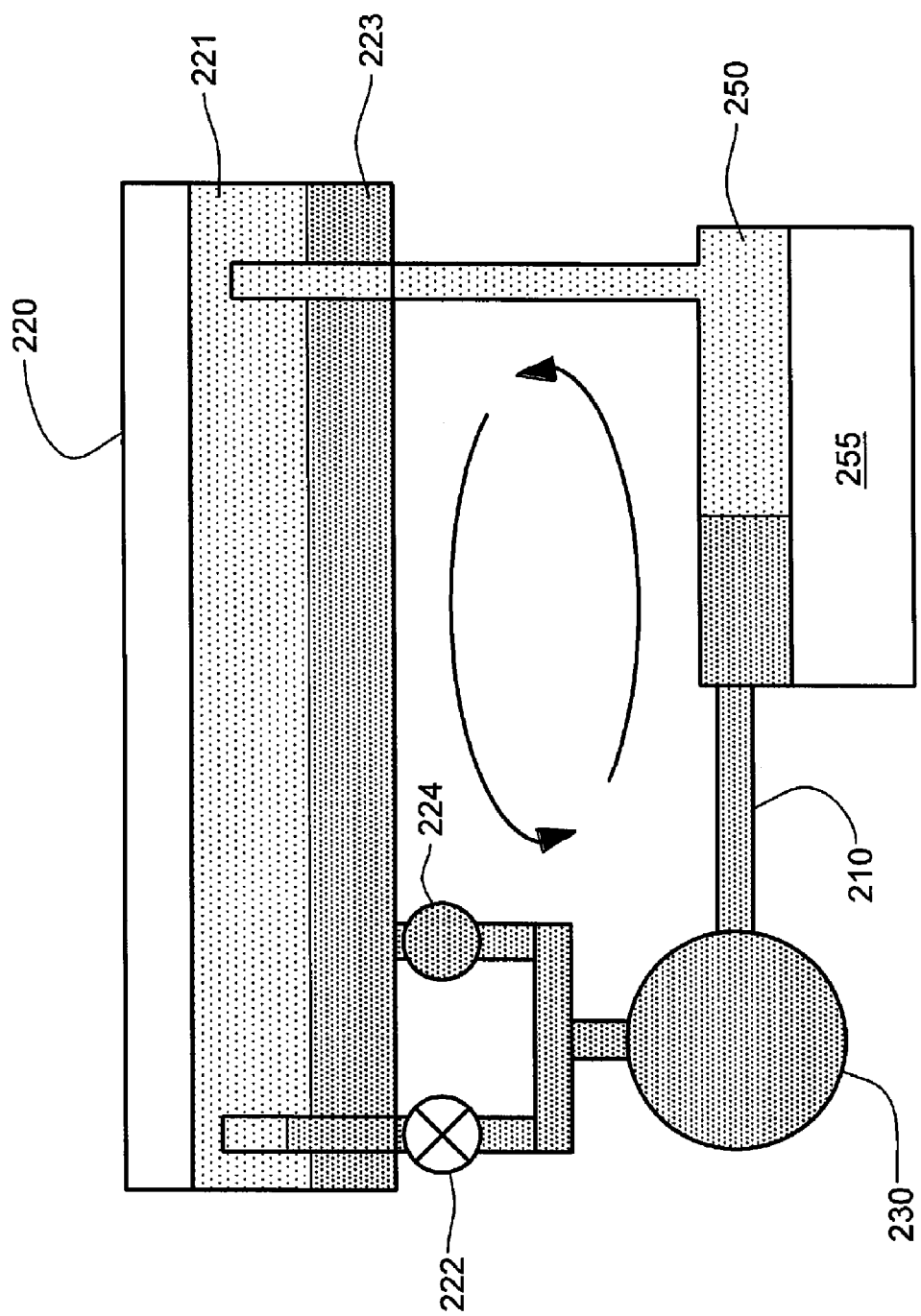

Next, valve 222 in the water supply line is closed to prevent entry of water into the main coolant loop (see FIG. 6C), and fluid pump 230 is activated resulting in fluorocarbon liquid 223 displacing water 221 within the active components of the coolant loop, as illustrated in FIGS. 6D & 6E. The resultant shipping state attained is illustrated in FIG. 3.

Figure 7:
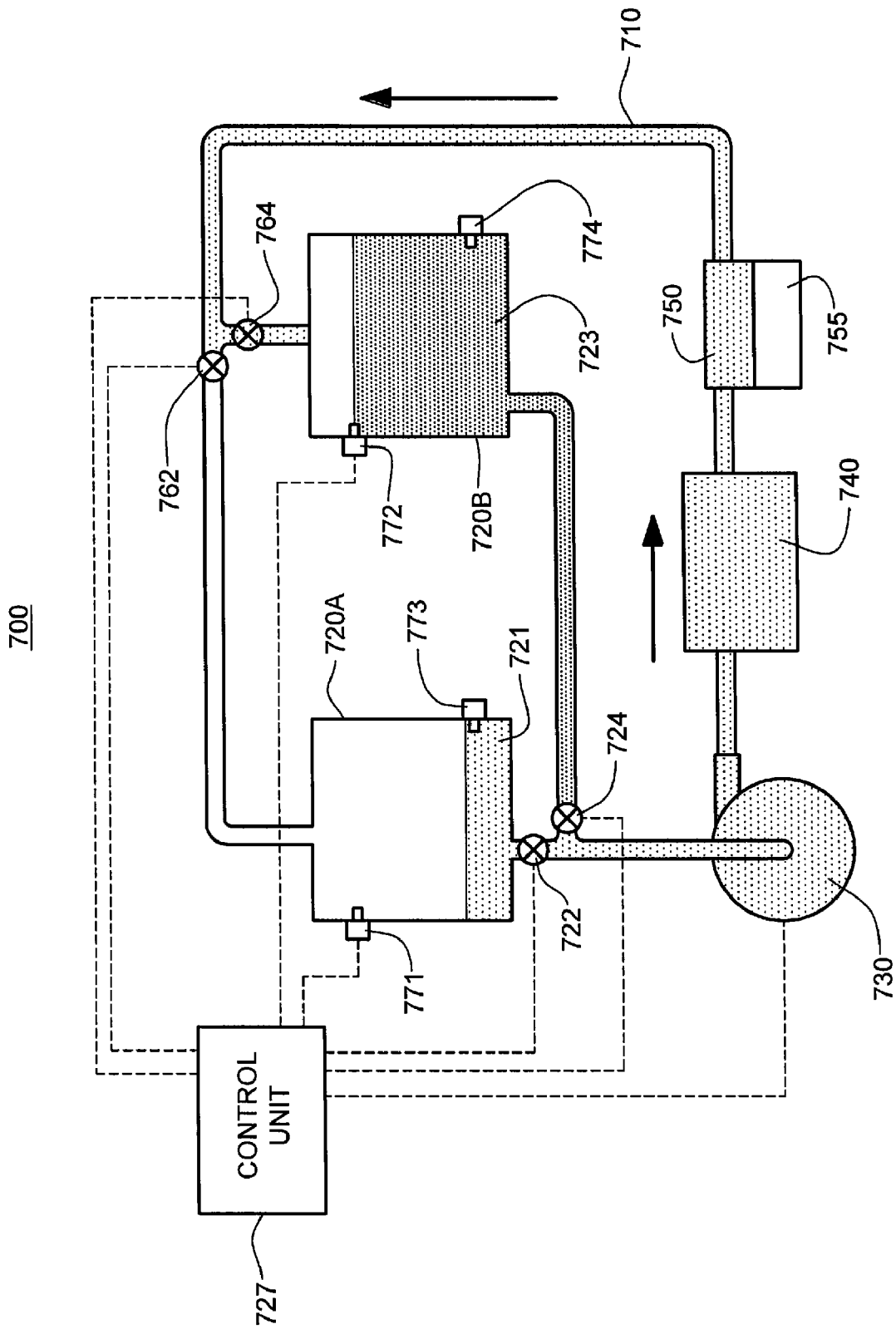
FIG. 7 is a schematic of an alternate embodiment of a multi-fluid, liquid-to-air cooling system with freeze protection, in accordance with an aspect of the present invention.

By way of further example, FIG. 7 depicts an alternate embodiment of a liquid-to-air cooling system 700, in accordance with an aspect of the present invention. Cooling system 700 is a dual tank architecture, which possesses freeze protection again using two immiscible fluids, for example, water 721 and fluorocarbon 723. A first tank 720A is used as a reservoir for the primary coolant (e.g., water) for the operational state, while a second expansion tank 720B is used as a reservoir for the freeze protect fluid (e.g., fluorocarbon) employed during the shipping state.

In this example, liquid-to-air cooling system 700 includes a coolant loop 710, with expansion tanks 720A, 720B, a fluid pump 730, a liquid-to-air heat exchanger 740, and a cold plate 750, which is shown coupled to an electronic device 755 to be cooled. Control unit or logic 727 is coupled to a first valve 722, a second valve 724, a third valve 762 and a fourth valve 764, as well as fluid pump 730. Valves 722, 724, 762 & 764 are controllably electrically actuated by control unit 727 to automatically transfer the primary coolant 721 or freeze protect fluid 723 into the active components of coolant loop 710.

A basic requirement for this embodiment is that the first fluid and the second fluid again be immiscible and that the freeze protection offered by the second fluid have, for example, a freezing point below −40° C. Further, for this embodiment, the specific gravity or density of the two fluids is not critical, and therefore, it is not necessary that the freeze protect fluid have a higher specific gravity than the primary coolant. In operation, the cooling system is charged at the manufacturer by filling expansion tank 720A with a predetermined amount of primary coolant (e.g., water), and expansion tank 720B with a predetermined amount of freeze protect fluid (e.g., fluorocarbon). This brings the liquid level in both tanks to a height slightly (e.g., 2-4 mm) above the level of a liquid level sensor placed in the upper portion of each tank.

In particular, expansion tank 720A includes an upper level liquid level sensor 771, while expansion tank 720B includes an upper liquid level sensor 772 disposed as shown. Prior to shipment, the cooling system is tested for normal operation. When the associated computer is turned on for the first time, the liquid level sensors in expansion tanks 720A & 720B will give an indication that both tanks are full. Under this condition, the control logic opens control valve 722 and control valve 762, and the fluid pump is activated. Primary coolant fills the coolant loop and is circulated for return to expansion tank 720A. The coolant level in expansion tank 720A drops to that shown in FIG. 7. In the operating state, control valves 724 & 764 remain closed.

Upon completion of power on testing, the cooling system is readied for shipment by entering the appropriate command through, for example computer software. Upon receipt of the command, the control logic closes control valve 722 and opens control valve 724. Further, control valve 762 remains open and control valve 764 remains closed. The primary coolant remaining in the coolant loop continues to return to expansion tank 720A, while the freeze protect fluid replaces the primary coolant in the coolant loop, including the heat exchanger and cold plate. As the primary coolant returns to expansion tank 720A, the liquid level in the tank rises until reaching the level of upper liquid level sensor 771. Once this happens, a signal from upper liquid level sensor 771 indicates that all primary coolant has been returned from the coolant loop, and the control logic closes control valve 762 and opens control valve 764. Before shutting down, the control logic also logs the current state of the cooling system, i.e., shipping state (or freeze protect mode).

When the computer is again powered on, the operating system checks for the state (i.e., shipping state) of the cooling system. If the cooling system is in shipping state, the control logic closes control valve 724 and activates fluid pump 730. The control logic opens control valve 722 and freeze protect fluid begins to return to and fill expansion tank 720B. When the freeze protect fluid reaches the level of upper liquid level sensor 772, the control logic closes control valve 764 and opens control valve 762. At this point, the cooling system is in the operational state circulating the primary coolant throughout the coolant loop, and the control logic allows the operating system to power up the remainder of the computer system.

Also provided in the system of FIG. 7 are lower liquid level sensors 773 and 774 in expansion tanks 720A & 720B, respectively. These lower liquid level sensors provide a warning should the liquid level in either tank drop below an unsafe level.

Figure 8:
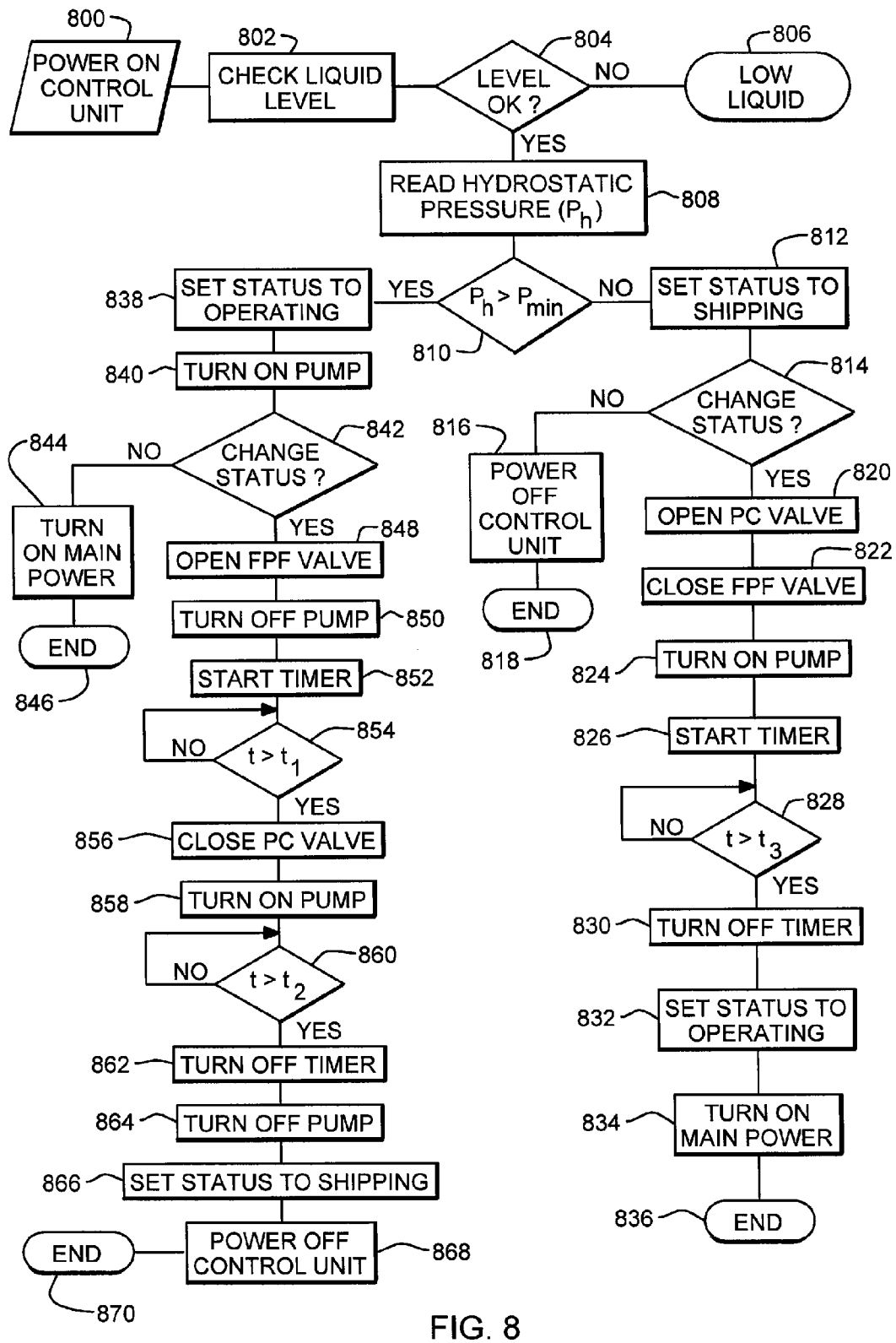
FIG. 8 is a flowchart of one embodiment of processing implemented by the control logic of the cooling system of FIGS. 3-6E, in accordance with an aspect of the present invention.

By way of further detail, FIG. 8 is a flowchart of one embodiment of processing implemented by the control logic of the multi-fluid cooling system of FIGS. 3-6E. In this embodiment, the control logic includes computer-implemented processes configured to read sensors in the expansion tank (such as a liquid level switch and a hydrostatic pressure transducer), and to control power to the cooling system's solenoid valves, and fluid pump, as well as to the associated processor or memory components to be cooled. After control unit power on 800, liquid level in the expansion tank is checked 802 to confirm that the anticipated total volume of primary coolant (PC) and freeze protect fluid (FPF) is present in the expansion tank 804. This can be determined via a liquid level switch in the upper portion of the tank. If the liquid level is too low, a "low liquid" message is sent or displayed, and the power up sequence is aborted 806.

Assuming that the liquid level in the expansion tank is sufficient, the hydrostatic pressure due to the combined head of the primary coolant and the freeze protect fluid in the expansion tank is determined 808, for example, from a pressure sensor mounted in a lower sidewall of the expansion tank. If the hydrostatic pressure ($P_h$) is above the minimum value ($P_{min}$) 810, a status indicator is set to the operational state 838 (processing for which is described further below). If the hydrostatic pressure ($P_h$) is equal to the minimum value ($P_{min}$), then the status indicator is set to the shipping state 812.

Assuming first that the shipping state is set, then a query is sent to determine whether the user wishes to change the cooling system state 814. If "no", then the control unit is powered off 816 and processing ends 818 with the cooling system in the shipping state (i.e., ready-to-ship mode). If the user wishes to change the cooling system's status, then the primary coolant (PC) valve is opened 820 and the freeze protect fluid (FPF) valve is closed 822, after which the fluid pump is turned on 824 and a timer 826 is set. Once the timer's elapsed time exceeds a predetermined value $t_3$ 828 (that is, a sufficient time to allow the primary coolant to transition into the coolant loop and the freeze protect fluid to return to the expansion tank), the timer is turned off 830 and the status indicator is set to the operational state 832. Main power is then turned on to the associated computer components (e.g., processor and memory components) 834, and control processing is complete 836, with the cooling system and associated computer in the operational state.

Returning to the left-hand branch of the control processing, from the set status to operational state 838, power is applied to fluid pump 840 and the user is queried whether a change of cooling system status is desired 842. If "no", then power is applied to the associated computer components 844, and control processing ends 846, with the cooling system in the operational state.

If a cooling system status change is desired, then the freeze protect fluid valve is opened 848 and the fluid pump is turned off 850. A timer is started 852, and once elapsed time exceeds a predetermined time $t_1$ 854, the primary coolant valve is closed 856 and the fluid pump is turned back on 858. Waiting time $t_1$ allows the freeze protect fluid (FPF) to displace the primary coolant (PC) in at least a portion of the primary coolant line, as described above in connection with FIG. 6B. Once the elapsed time exceeds a second predetermined value $t_2$, the timer circuit is turned off 862, the fluid pump is deactivated 864 and the status indicator is set to shipping state 866. Waiting time $t_2$ provides the time needed for the freeze protect fluid to replace the primary coolant in the coolant loop. Thereafter, the control logic is powered off 868 and processing ends 870 with the cooling system in the shipping state.

The control logic capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a computer embodying at least one program of instructions executable by the computer to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention, and that these are therefore considered to be within the scope of the invention as defined in the following claims.

What is claimed is:

1. A method of providing a cooling system of a computer system with freeze protection during shipping, the method comprising:
    providing a cooling loop configured to facilitate cooling of an electronic device of a computer system, the cooling loop being in fluid communication with at least one expansion tank containing a primary coolant and a freeze protect fluid, the primary coolant and the freeze protect fluid being immiscible, the primary coolant having superior cooling properties compared to the freeze protect fluid, and the freeze protect fluid freezing at a lower temperature than the primary coolant, and wherein the cooling loop further comprises multiple valves, the multiple valves including a first valve and a second valve coupled to respective supply lines extending from the at least one expansion tank for selectively, controllably coupling only one of the primary coolant or the freeze protect fluid at a time into the cooling loop from the at least one expansion tank, the first valve and the second valve being independently controllable;
    placing the cooling system into a shipping state with the freeze protect fluid in the cooling loop and with control logic of the cooling system controlling the first valve and the second valve to automatically maintain the freeze protect fluid in the cooling loop while the cooling system is in the shipping state, the shipping state being a non-operational state, wherein in the shipping state, substantially all primary coolant is in the at least one expansion tank, and wherein the at least one expansion tank is sized to accommodate freezing of the primary coolant therein when the cooling system is in the shipping state; and
    prior to employing the cooling system to cool the electronic device of the computer system, transitioning the cooling system from the shipping state to an operational state by flushing the freeze protect fluid from the cooling loop into the at least one expansion tank employing the primary coolant, wherein the cooling system achieves the operational state once the freeze protect fluid is replaced in the cooling loop by the primary coolant, and wherein the freeze protect fluid is selected to protect components of the cooling system from freezing when the cooling system is in the shipping state, and the primary coolant is selected to facilitate cooling of the electronic device of the computer system when the cooling system is in the operational state.

2. The method of claim 1, further comprising performing the placing of the cooling system into the shipping state prior to shipping the cooling system to a customer, and wherein the transitioning occurs upon power up of the cooling system for the first time subsequent to arrival at the customer's site, and before operational use of the cooling system to cool the electronic device of the computer system.

3. The method of claim 1, further comprising automatically determining a hydrostatic pressure within the at least one expansion tank to determine whether the cooling system is in the shipping state or the operational state after the cooling system is powered on, and before the electronic device to be cooled is powered on.

4. The method of claim 1, further comprising delaying applying power to the electronic device until after the cooling system has reached the operational state, with the primary coolant flowing through the cooling loop.

5. The method of claim 1, wherein the cooling system further comprises a coolant pump in fluid communication with the cooling loop, and the transitioning comprises pumping the primary coolant through the cooling loop when transitioning from the shipping state to the operational state, and the control logic automatically controls the coolant pump and actuation of the first valve and the second valve to perform the transitioning of the cooling system from the shipping state to the operational state.

6. The method of claim 5, wherein the transitioning comprises employing the control logic to automatically control transitioning of the cooling system from the shipping state to the operational state by closing the second valve and opening the first valve, and thereafter pumping the primary coolant through the cooling loop, to thereby return the freeze protect fluid to the at least one expansion tank.

7. The method of claim 1, further comprising transitioning the cooling system from the operational state to the shipping state by shutting down a coolant pump in fluid communication with the cooling loop, opening the second valve and using gravity to allow the freeze protect fluid to flow into the first valve to a level of the freeze protect fluid in the expansion tank, the freeze protect fluid having a density greater than the primary coolant, and thereafter closing the first valve, and activating the coolant pump to move the freeze protect fluid into the cooling loop and thereby move the primary coolant from the cooling loop, returning the primary coolant to the at least one expansion tank.

8. The method of claim 1, wherein the providing comprises selecting the freeze protect fluid to have a greater density than the primary coolant, and thereby occupy a lower portion of the at least one expansion tank, and wherein the at least one expansion tank is disposed above the cooling loop to allow gravity to facilitate transitioning of the cooling system from the operational state to the shipping state.

9. The method of claim 1, wherein the cooling loop is in fluid communication with two expansion tanks, a first expansion tank containing the primary coolant and a second expansion tank containing the freeze protect fluid, and wherein the cooling loop further comprises a third valve and a fourth valve, (he first valve and the second valve controlling egress of primary coolant and freeze protect fluid from the first expansion tank and the second expansion tank, respectively, and the third valve and the fourth valve controlling ingress of primary coolant and freeze protect fluid to the first expansion tank and the second expansion tank, respectively, and wherein the control logic controls actuation of the first valve, second valve, third valve and fourth valve to automatically pass the primary coolant through the cooling loop when the cooling system is in the operational state and to automatically maintain the freeze protect fluid in the cooling loop when the cooling system is in the shipping state.

10. The method of claim 9, further comprising employing a first level sensor in the first expansion tank and a second level sensor in the second expansion tank to automatically sense whether the cooling system is in the shipping state or the operational state, and to provide feedback in controlling transitioning of the cooling system between the shipping state and the operational state.

11. The method of claim 1, wherein the providing comprises sealing the cooling system with the primary coolant and the freeze protect fluid disposed therein.

* * * * *